SIGNAL TRANSLATING CIRCUIT COMPRISING A PLURALITY OF IGFET AMPLIFIERS CASCADED IN DIRECT COUPLED FASHION
Filed July 23, 1968

INVENTOR
JOSEPH R. BURNS

BY Robert R. Hubbard
ATTORNEY

United States Patent Office 3,516,004

Patented June 2, 1970

3,516,004

SIGNAL TRANSLATING CIRCUIT COMPRISING A PLURALITY OF IGFET AMPLIFIERS CASCADED IN DIRECT COUPLED FASHION

Joseph R. Burns, Trenton, N.J., assignor to RCA Corporation, a corporation of Delaware Continuation-in-part of application Ser. No. 610,439, Jan. 19, 1967. This application July 23, 1968, Ser. No. 746,796

Int. Cl. H03f 3/16

U.S. Cl. 330—19 16 Claims

ABSTRACT OF THE DISCLOSURE

A self-biased direct coupled amplifier employing a common source connected insulated gate field-effect transistor (IGFET) with a series drain impedance in each of plural cascade-connected stages is disclosed, which amplifier is capable of integrated circuit fabrication. In one of the stages, illustrated as the first stage, the series impedance is the source-drain path of an input IGFET connected in the common drain (source-follower) configuration so that the source-drain path of the associated common source IGFET serves as a load therefor. Input signal voltage is applied to the gate electrode of the source-follower. A self-biasing feedback element (for example, the source-drain path of a further IGFET) is connected between the last stage output and the gate electrode of the first stage common source IGFET, whereby the amplifier input signal source circuit is isolated from the feedback element and forms no part of the feedback stability network. Also disclosed is a difference amplifier employing two adjacent source follower stages, the second of which also serves as a common source unity gain inverter.

This application is a continuation-in-part of my copending application for "Signal Translating System," No. 610,439, filed Jan. 19, 1967, now abandoned.

CROSS REFERENCE

My copending application Ser. No. 563,018, entitled "Amplifier," filed on June 27, 1966, describes self-biased direct coupled IGFET amplifiers.

BACKGROUND OF THE INVENTION

It is well known that inverting type amplifying stages which include a load impedance, a power supply terminal, and an amplifying device such as a bipolar transistor, field-effect transistor, or the like, can be self-biased by connecting a feedback impedance, for example a resistor, between the output and input terminals of the device. For example, U.S. Pat. No. 2,750,456 to Waldhauer discloses a self-biasing arrangement of this type for bipolar transistors while my aforesaid copending application discloses self-biasing arrangements for field-effect transistors. The effect of the feedback impedance is to provide an appropriate distribution of power supply current and voltage to the input and output terminals of the device such that the device stabilizes at a desired operating point.

For the case of an insulated gate field-effect transistor (IGFET), there can be substantially no D.C. (direct current) current flow through the feedback resistor since the gate current is negligible due to the insulated layer between the gate and the conduction path of the transistor. Thus, with substantially no D.C. current flowing through the feedback resistor, the condition $V_{gs}=V_{ds}$ is established for D.C. voltages, where $V_{gs}$ is the gate-to-source voltage and $V_{ds}$ is the drain-to-source voltage. This condition is particularly attractive for use in cascade direct coupled amplifiers since the output terminal of one IGFET stage can be directly coupled as by a conductor or direct current impedance means to the input electrode of another IGFET stage. In fact, a plurality $n$ of cascaded IGFET stages can be directly coupled in this manner with only a single feedback element employed between the output electrode of the last stage and the input electrode of the first stage to establish the D.C. operating point of $V_{gs}=V_{ds}$ for each stage of the amplifier. Of course, the plurality $n$ must be an odd number in order to maintain a phase inversion or reversal to insure that the D.C. feedback is degenerative.

Due to the phase relation between the input and output electrodes of either a single stage or an odd number $n$ of cascaded stages, a low pass filter is generally employed to prevent or minimize signal degeneration at the input electrode in the frenquency range of interest. One prior art low pass filter includes the feedback element $Z_f$ in combination with a coupling capacitor $C_c$ which also couples the signal voltage source $E_s$ to the input electrode of the amplifier. Although this type of filter is adequate for applications requiring low or negligible source impedance, stability problems are encountered when the amplifier is driven from a high impedance source. That is, the source impedance $Z_s$ is in series with the coupling capacitor $C_c$ and hence forms a part of the $Z_f$ and $C_c$ stabilizing network. In essence, the high source impedance $Z_s$ cannot be neglected so that some signal feedback occurs at high frequencies which may either cause oscillation or reduce the stability margin so much that oscillation could be caused by various drift factors.

A further objection to this type of low pass filter is that it tends to reduce the A.C. input impedance of the amplifier since the effective A.C. feedback impedance $Z_{f(A.C.)}$ is in parallel with the first stage input impedance. Because of the Miller effect, $Z_{f(A.C.)}$ is essentially $$\frac{Z_f}{1+A}$$

where —A is the amplifier gain. Depending upon the design specifications for $Z_f$ and A, the input signal voltage could be severely attentuated. This is especially a problem where integrated circuit fabrication techniques place upper limits on the values of $Z_f$ due to economic considerations.

BRIEF SUMMARY OF INVENTION

According to one example of the present invention useful for A.C. or time varying signal voltage amplification, there is provided a plurality of stages cascaded in a direct coupled fashion. Each stage of the amplifier includes a first insulated gate field-effect transistor (IGFET) connected in the common source configuration and a series impedance connected to the drain electrode thereof. In at least one of the stages, for example the first stage, the series impedance is the source-drain path of a second IGFET connected in the source-follower configuration. Input signal voltage is applied to the input or gate electrode of the source-follower device, whereby the source-drain path of the associated common source IGFET serves as a load impedance for the source follower. Self-biasing is achieved by means of a feedback element coupled between the drain electrode of the last stage common source IGFET and the gate electrode of the first stage common source IGFET, whereby its conduction is varied in response to drift signal changes occurring at the last stage output connection. Radio frequency stabilization is acheived by means of a filter which may include the feedback element connected in circuit with a bypass capacitor. In one embodiment the bypass capacitor is connected between the gate electrode of the first stage common source IGFET and the amplifier reference, for example circuit ground. The feedback element may include either a resistor or the conduction path of one or more IGFET's. Thus, the input signal voltage circuit is isolated from the self-biasing and stabilization circuit so that the amplifier input impedance is dependent only upon the input impedance of the input source-follower IGFET. According to one illustrated embodiment of the invention, the series impedances in the remainder of the stages may preferably be the source-drain paths of further IGFET's having their gate electrode connected to a point of fixed potential.

In another illustrated embodiment, signal addition in the form of a difference function is achieved by utilizing two adjacent stages as source followers for two input signals $e_1$ and $e_2$. The second or succeeding one of the stages is also utilized as a common source unity gain stage such that the signals $e_1$ and $e_2$ are combined at the second stage output to provide a difference signal $e_2—e_1$. The stage gains in the D.C. bias loop are such that they monotonically increase in either direction from the unity gain stage toward a maximum gain stage.

In a further embodiment of the invention useful for amplifying slowly varying or D.C. signal voltage, the direct coupled amplifier apparatus further includes a pair of IGFET's arranged in a sampling or chopper circuit with direct coupled connections to the input of the first stage source-follower IGFET.

BRIEF DESCRIPTION OF DRAWINGS

In the accompanying drawings, like reference characters denote like elements, and.

DESCRIPTION OF PREFERRED EMBODIMENTS

An IGFET may generally be defined as a majority carrier field-effect device which includes a body of semiconductor material. A carrier conduction channel within the semiconductive body is bound at one end thereof by a source region and at the other end thereof by a drain region. The gate or control electrode means overlies at least a portion of the carrier conduction channel and is separated therefrom by a region of insulating material. Due to the insulation between the gate electrode and the channel, the input impedance of the insulated gate field-effect transistor is very large on the order of $10^{15}$ ohms or more, so that substantially no D.C. current flows in the gate electrode circuit. Thus, the insulated gate field-effect transistor is a voltage controlled device. Signals or voltages applied to the gate electrode means control, by field-effect, the conductance of the channel.

Such transistors may be of either the enhancement type or the depletion type. In a depletion type transistor there is current flow through the conduction channel when the source and gate electrodes have the same voltage ($V_{gs}=0$). This current flow either increases or decreases depending upon the polarity of the applied voltage between the gate and source electrodes. In an enhancement type transistor there is substantially no current flow through the conduction channel until $V_{gs}$ is at least equal in magnitude to the threshold voltage $V_t$ and of the same polarity as the drain-to-source voltage ($V_{ds}$).

An IGFET may be of either a P-type or an N-type transistor depending upon the majority carriers involved in drain current conduction. A P-type transistor is one in which the majority carriers are holes; whereas an N-type unit is one in which the majority carriers are electrons.

Direct coupled amplifier apparatus embodying my invention may be constructed either with discrete components or by means of integrated circuit processes. As used herein, the term, integrated circuit, refers to those techniques by which an entire circuit can be formed as by diffusion or by thin films in or on one or more chips of suitable substrate material. For example, in the case of metal oxide semiconductors (MOS) IGFET's, the substrate material could be silicon; while for the case of thin film IGFET's, the substrate material could be an insulator, such as glass or sapphire. Direct coupled amplifiers are particularly suited for integrated circuit structures and devices since they employ no A.C. coupling elements, such as transformers and capacitors, which elements are at the present time either impractical in the case of transformers, or not economically feasible, in the case of capacitors, to fabricate in integrated form. Integrated circuit structures or chips upon which amplifiers are formed are useful as basic building blocks which may be interconnected and combined with appropriate power supplies and signal sources to form various signal translating systems.

Figure 1:
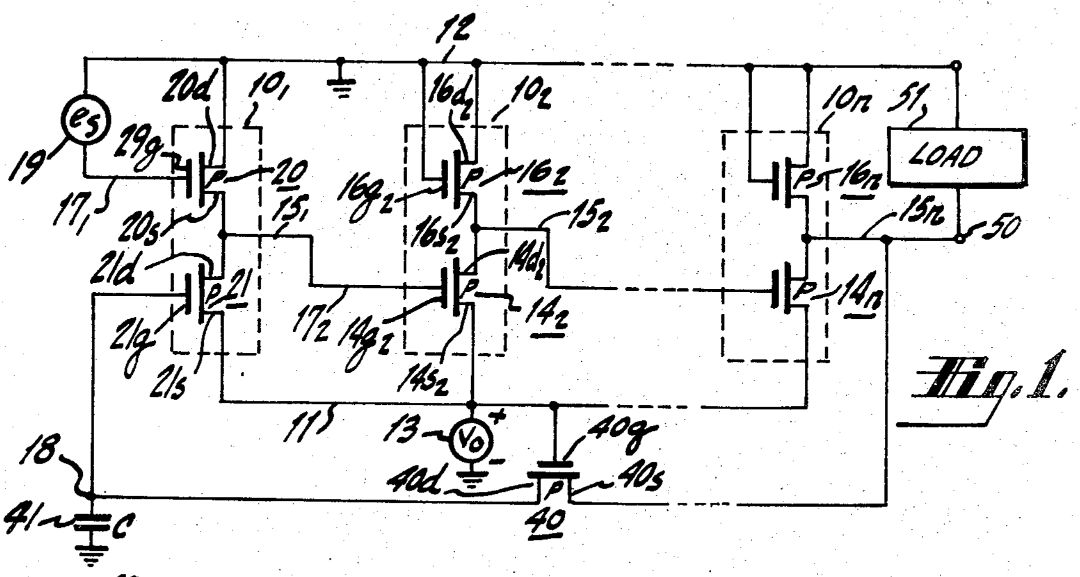
FIG. 1 is a schematic circuit diagram of a preferred embodiment of direct coupled amplifier apparatus according to the present invention.

Referring now to FIG. 1, a preferred example of the self-biased direct coupled amplifier apparatus of the present invention is illustrated as having *n* cascaded stages of amplification identified in a progressive order from the first stage to the last stage by the references $10_1$, $10_2$ . . . , and $10_n$. Each of the stages 10 is connected between a pair of supply connections 11 and 12. The supply connection 11 is connected to the positive terminal of a source 13 of suitable operating potential, the negative terminal of which is connected to a point of fixed reference potential, illustrated in FIG. 1 as circuit ground by the conventional symbol therefor. The source 13, for example, may be a battery capable of providing a voltage $V_o$ volts D.C. The supply connection of 12 is connected to the fixed reference potential or circuit ground.

A source 19 of input signal voltage has an output terminal connected by way of a direct current conducting means, for example, a conductor, to the input connection $17_1$ of the first stage $10_1$. The other terminal of the source 19 is connected to the ground reference by way of the supply connection 12. The source 19 may be any suitable source for applying an A.C. input signal voltage $e_s$ to the input connection $17_1$. The A.C. signal can be any time varying signal.

The amplifier stages $10_1$ through $10_n$ are self-biased by means of direct coupling connections which connect the stages in cascade about a closed loop. To this end, the stage $10_1$ has its output connection $15_1$ connected to the input connection $17_2$ of the second stage $10_2$, which in turn has its output connection $15_2$ connected to the input of the third stage (not shown) and so on to form a direct coupled cascade amplifier. The output connection $15_n$ of the last stage $10_n$ is connected to an output terminal 50, which in turn is connected to a suitable utilization device shown as a load 51 connected between output terminal 50 and the ground reference by way of supply connection 12.

To complete the closed loop, the last stage output connection $15_n$ is further connected by way of a feedback path to a feedback point 18 at the first stage $10_1$. The feedback path includes a suitable series feedback impedance 40. Although the impedance 40 may be a resistor, it preferably is the source-drain path of an insulated gate field-effect transistor, illustrated as a P-type IGFET. Transistor 40 has its source electrode **40*s* connected to the last stage output connection $15_n$ and its drain electrode 40*d* connected to the self-biasing point 18 for the first stage $10_1$. The gate electrode 40*g* is connected to a suitable source of fixed voltage such as the $V_o$ volts supply connection 11. The feedback point 18 is also connected to the ground reference by way of a bypass filter capacitor 41, designated as C. It should be noted that the gate electrode 40*g* may be connected to any fixed voltage which biases IGFET 40** in such a manner so that its source-drain path exhibits a desired impedance value.

In the first stage $10_1$, the amplifying device 20 is illustrated as a P-type IGFET connected in a common drain or source-follower configuration. To this end, the gate electrode 20*g* is connected to the first stage input connection $17_1$. The drain electrode 20*d* is connected to the ground reference via the supply connection 12, while the source electrode 20*s* is connected both to the first stage output connection $15_1$ and the source-drain path of another P-type IGFET 21 which serves as a series load impedance for the source-follower transistor 20. The transistor 21 has its drain electrode 21*d* connected to the first stage output connection $15_1$ and its source electrode 21*s* connected to the supply connection 11. The gate electrode 21*g* is connected to the feedback point 18.

Each of the stages from $10_2$ through $10_n$ have like circuit connections such that the following description of the stage $10_2$ is applicable to the succeeding stages through stage $10_n$. In stage $10_2$ the amplifying device $14_2$ is illustrated as a P-type IGFET connected in a common source configuration. To this end, the source electrode $14s_2$ is connected to the supply connection 11, while the drain electrode $14d_2$ is connected both to the second stage output connection $15_2$ and a load impedance $16_2$. The gate electrode $14g_2$ is connected to the second stage input connection $17_2$.

Although the load impedance $16_2$ may be a resistor, it preferably takes the form of the source-drain path of a P-type enhancement IGFET. To this end, the source electrode $16s_2$ is connected to the output connection $15_2$ and the drain electrode $16d_2$ is connected to the supply connection 12. The gate electrode $16g_2$ is connected to circuit ground by way of the supply connection 12. It should be noted that gate electrode $16g_2$ could alternately be connected to some fixed potential other than the one to which drain electrode $16d_2$ is connected as the fixed potential maintains IGFET $16_2$ in a conductive condition throughout the range of linear amplification.

As mentioned previously, IGFET $16_2$ is preferred over a resistor as the series load impedance for common source IGFET $14_2$. This is because the illustrated IGFET stage $10_2$ provides an extremely linear amplifier since the absolute value of the voltage gain is proportional to the relative linear dimensions of the IGFET's $14_2$ and $16_2$, which dimensions are easily controlled in integrated circuits. Assuming that the effective mobility $\mu$ of the carriers, the permittivity $\epsilon$ of the gate insulator and the thickness T of the gate insulator are the same for both IGFET's, the voltage gain $G_V$ of the stage $10_2$ (as well as the succeeding stages inclusive of stage $10_n$) can be expressed as $$G_V = -\sqrt{\frac{W_{14}L_{16}}{W_{16}L_{14}}} = -g_{m14}R_L \qquad (1)$$

where $W_{14}$ and $L_{14}$ are the width and length, respectively, of the channel of IGFET 14, where $W_{16}$ and $L_{16}$ are the width and length, respectively, of the IGFET 16, where $g_{m14}$ is the transconductance of IGFET 14 and where $R_L$ is the load impedance. What this means is that $G_V$ is essentially a constant so that as $g_{m14}$ increases with applied signal voltage, $R_L$ decreases at the same rate such that the product $g_{m14}R_L$ remains constant throughout the range of linear amplification. For the case where the load impedance $16_2$ is a constant-valued load resistor, the voltage gain product $g_{m14}R_L$ varies directly with applied signal voltage since $R_L$ is constant. Consequently, the linear amplifying range for the constant-valued resistor load stage is somewhat limited compared to that for the IGFET load stage. It should be noted that the IGFET load is sometimes referred to as a field-effect diode or MOS diode where MOS field-effect devices are employed.

The entire amplifier is self-biased by means of the source-drain path of the feedback IGFET 40 which sets up the D.C. voltage condition of $V_{gs}$ equals $V_{ds}$ for IGFET

21 for stage $10_1$ and for each of the IGFET's 14 in the stages $10_2$ through $10_n$. This condition is achieved since there can be substantially no current flow through the source-drain path of IGFET 40 due to the insulated gate of IGFET 21 and the bypass capacitor 41. This feedback is essentially D.C. since the by-pass capacitor 41 shorts the signal voltage to ground throughout the frequency range of interest, that is, IGFET 40 and capacitor 41 cooperate as a low pass filter to pass only D.C. or slowly varying signals, such as drift signals.

As is known, slowly varying signals or drift signals may occur due to factors internal to the amplifier such as thermal effects, threshold voltage changes, component aging, etc. or due to external factors such as supply voltage drift. The net effect of drift due to any of these factors is to cause a slowly varying drift signal $\Delta V$ at the ouput connection $15_n$ of the last stage $10_n$. Assuming that such a drift signal is positive ($+\Delta V$) and that the number of stages *n* is an odd number, the $+\Delta V$ drift signal is fed back in a degenerative fashion so as to become self-correcting. That is, the feedback loop is operative to feed back an amplified drift signal which is out-of-phase with the drift signal $\Delta V$. It should be noted that first stage IGFET 21 acts as a common source amplifier for drift signals with IGFET 20 as a load. For the case where the IGFET's 20 and $16_2$ through $16_n$ have substantially identical geometries and IGFET's 21 and $14_2$ through $14_n$ have substantially identical geometries, the feedback loop is operative to reduce the total drift to a value of $$\frac{-G_V{}^n \Delta V}{1+G_V{}^n}$$

which is approximately equal to $-\Delta V$. It should be noted that the preceding discussion is concerned only with slowly varying D.C. or drift signals and is not indicative of the A.C. or signal gain. Assuming that the gain of the source-follower IGFET 20 is unity, the A.C. signal voltage gain is $+G_V{}^{n-1}$ such that the amplifier is non-inverting for signal voltage. It should be noted that for the case where the IGFET geometry differs from stage to stage, the A.C. signal gain becomes the product of the gains in each stage.

A general advantage of the present invention is that the source impedance $Z_s$ of source 19 is completely isolated from the low pass filter feedback network, whereby $Z_s$ has no effect on the stability of the D.C. feedback network, and the amplifier input impedance is determined primarily by the input impedance of the source-follower IGFET 20. Due to the insulated gate of IGFET 20, the amplifier input impedance is extremely high, on the order of $10^{15}$ ohms or more, whereby the amplifier may be driven directly without the use of coupling capacitors or transformers from a very high impedance source which is referenced to ground. For example, the source 19 may be a parallel tuned circuit or a transducer, such as a microphone.

At the amplifier output terminal 50, no coupling capacitor or transformer is necessary so long as the load or utilization device 51 does not draw D.C. current. For loads 51 that are capable of drawing D.C. current, an A.C. coupling device should be used in order to prevent disruption of the D.C. bias condtions of the amplifier.

In the embodiment of FIG. 1 all of the IGFET's are preferably of the enhancement type since the D.C. operating condition of $V_{gs}=V_{ds}$ occurs in the linear portion of the transfer characteristic. For depletion type IGFET's, the operating point for $V_{gs}=V_{ds}$ generally occurs in the nonlinear portion of the transfer characteristic such that a nonlinear amplifier results.

Automatic gain control (AGC) for the FIG. 1 amplifier may be achieved by providing an additional IGFET having its source-drain path connected as a feedback element in one of the internal stages $10_2$ through $10_n$. For example, the additional IGFET could have its source-drain path connected in stage $10_2$ between the gate electrode $14g_2$ and the drain electrode $14d_2$ without disturbing the D.C. condition of $V_{gs}=V_{ds}$. Automatic gain control signals could be applied to the gate electrode of the additional IGFET.

As described above, the signal source 19 is preferably coupled to the gate electrode 20*g* of the first stage IGFET 20. However, the signal source 19 could just as well be coupled to the gate electrode of any of the load IGFET's of stages $10_2$ through $10_n$. For example, an inverting type amplifier could be obtained by connecting the signal source 19 between gate electrode $16g_2$ of IGFET $16_2$ in stage $10_2$ and the grounded supply connection 12. The gate electrode 20*g* of IGFET 20 would then be coupled to supply connection 12.

Moreover, signal addition can be achieved by connecting two or more signal sources to different gate electrodes of the IGFET's 20 and $16_2$ through $16_n$. For example, separate signal sources could be connected to the gate electrodes of IGFET 20 and IGFET's $16_2$ through $16_n$ and the stage gains (transistor geometries) could be weighted, that is, different gains, to obtain a desired linear signal addition at the output terminal 50.

Figure 3:
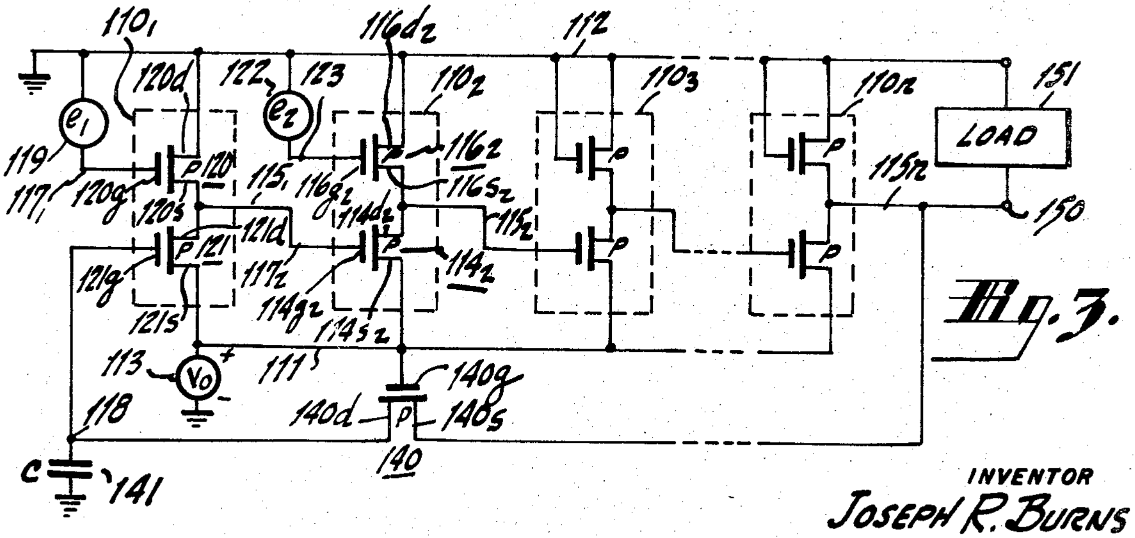
FIG. 3 is a schematic circuit diagram of a further embodiment of the invention.

As an example of linear signal addition, the special case of signal subtraction (difference function) for two signals $e_1$ and $e_2$ is illustrated in FIG. 3. In FIG. 3, the various circuit elements which correspond to similar elements in the FIG. 1 amplifier are identified by reference numerals having corresponding units and tens digits and also having a hundreds digit. Thus, the IGFET $114_2$ in stage $110_2$ of FIG. 3 corresponds to IGFET $14_2$ in stage $10_2$ in FIG. 1.

In FIG. 3, the signal provided by signal source 119 is identified as $e_1$ instead of $e_s$ as for source 19 in FIG. 1. Another signal source 122 of input signal voltage has an output terminal connected by way of a direct current conducting means, for example, a conductor, to one input connection 123 of the second stage $110_2$. The other terminal of the source 122 is connected to the ground reference by way of the supply connection 112. The source 122 may be any suitable source for applying an A.C. or time varying input signal voltage $e_2$ to the input connection 123. The other connections for the stage $110_2$ are similar to the connections for stage $10_2$ of FIG. 1. The stages $110_3$ through $110_n$ are similar to the stages $10_2$ through $10_n$ of FIG. 1 as illustrated by stages $110_3$ and $110_n$ such that a detailed description is unnecessary.

The stages $110_3$ through $110_n$ operate as common source stages both for A.C. (input signals) and for D.C. (drift and other slowly varying signals) signals. The stage $110_1$ operates as a source follower for input signal $e_1$ and as a common source stage for D.C. signals. Finally, stage $110_2$ acts as a source follower for input signal $e_2$ and as a common source stage both for signal $e_1$ and for D.C. signals. The voltage gain G for any of the stages $110_1$ through $110_n$ then is given by Equation 1.

The voltage gain of a source follower stage for an input signal is only slightly less than unity such that the source follower IGFET's $116_1$ and $116_2$ translate the associated input signals $e_1$ and $e_2$ to the first and second stage outputs $114_1$ and $115_2$, respectively, without appreciable amplification or attenuation.

The difference or signal subtraction function for input signals $e_1$ and $e_2$ is achieved at the second stage output $115_2$ by utilizing the second stage IGFET $116_2$ as a common source unity gain inverter for the signal $e_1$. That is, the ratio of the linear dimensions of second stage devices $114_2$ and $116_2$ in Equation 1 is unity. Thus, the signals $e_2$ and $e_1$ are combined at the second stage output $115_2$ to form a difference signal $e_2—e_1$. The difference signal $e_2—e_1$ is amplified by the remaining stages $110_3$ through $110_n$ and translated to the load 151.

The operating or bias point for any of the amplifier stages $110_1$ through $110_n$ is dependent on the gain of the stage. For instance, the D.C. drain voltage V*d* of the common source IGFET is given by $$Vd=V_o-V_T-G(V_g-V_T) \quad (2)$$

where $V_o$ is the supply voltage, $V_T$ is the threshold voltage of the common source IGFET, and $V_g$ is the gate voltage of the common source IGFET. When all the stages have the same gain (or same ratio of linear dimensions), V*d* turns out to be equal to V*g* for all stages in the amplifier. However, when one of the stages has unity gain (i.e., the ratio of linear dimension is one) and the other stages have gains appropriate to produce amplification, V*g* and V*d* are not identical for all stages to be biased in the high gain or active region of thin respective transfer characteristics for linear amplification.

To obtain bias points for each stage in the FIG. 3 amplifier which permit a maximum signal swing in the linear or high gain region, the stage gains are built up symmetrically in each direction from the unity gain stage to a maximum gain. That is, the two stages $110_1$ and $110_3$ on either side of the unity gain stage $110_2$ have identical gains which are larger than unity. Similarly, the gains of stages $110_n$ and $110_4$ have identical gains which are larger than the gains of stages $110_1$ and $110_3$, and so on, until a maximum gain is achieved. It is noted that for an odd number of stages two of the stages have the maximum gain. The table below shows the ratios of the relative linear dimensions of the IGFET's in each stage for a seven stage amplifier optimized to obtain a maximum linear signal swing.

Ratios of linear dimensions for seven stage amplifier

| Stage: | Ratio |
|---|---|
| 1 | 3.24 |
| 2 | 1 |
| 3 | 3.24 |
| 4 | 6.25 |
| 5 | 9.0 |
| 6 | 9.0 |
| 7 | 6.25 |

Although the symmetrical gain build-up about the self-biasing loop is optimum, it is to be understood that the difference amplifier stage gains need not be optimum. What is necessary to obtain a linear amplifier is that the stage gains monotonically increase to a maximum and thereafter monotonically decrease around the loop in either direction from the unity gain stage.

Figure 2:
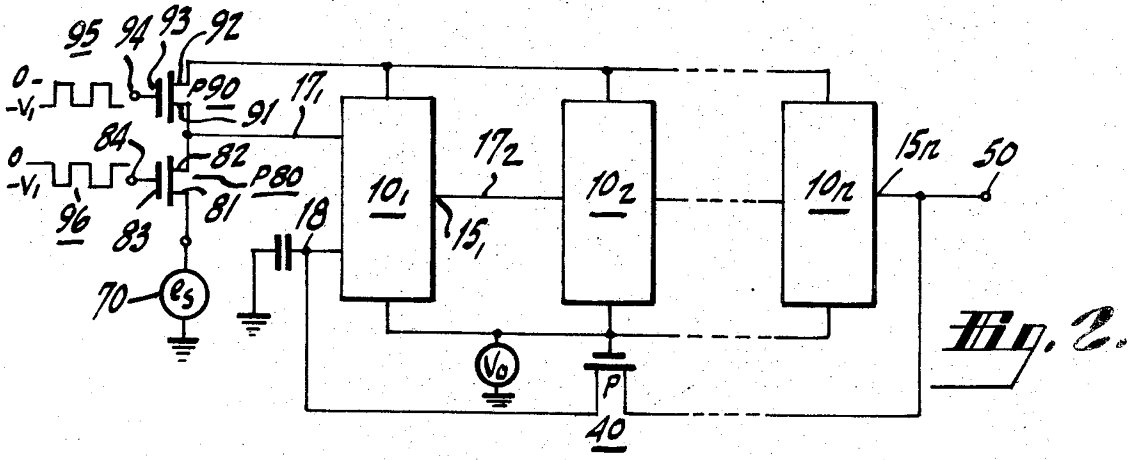
FIG. 2 is a schematic circuit diagram of another amplifier arrangement employing the FIG. 1 amplifier.

Referring now to FIG. 2, the FIG. 1 amplifier is embodied in a D.C. amplifier arrangement wherein stages $10_1$, $10_2$ . . . and $10_n$ are connected in the same manner as shown in FIG. 1. A signal source 70 having one terminal connected to circuit ground applies slowly varying or D.C. signal voltage by way of its output terminal to a sampling circuit. The sampling circuit includes enhancement P-type IGFET's 80 and 90 having their source-drain paths connected in series between the signal source output terminal and circuit ground. To this end, the source-drain path of IGFET 80 has one electrode 81 connected to the output terminal of the signal source 70 and another electrode 82 connected to an electrode 91 of the source-drain path of IGFET 90. The other source-drain path electrode 92 is connected to circuit ground. The electrodes 82 and 91 are connected to the input connection $17_1$ of the first stage $10_1$ of the amplifier. The gate electrodes 83 and 93 are connected to input terminals 84 and 94, respectively. The input terminals 84 and 94 are adapted to receive phase-inverted switching signals 95 and 96, respectively, such as the 0 volt to $—V_1$ volts square waves. The switching signals 95 and 96 may be derived from a suitable switching signal source (not shown). The $V_1$ volt magnitude is assumed to be greated than the threshold voltage of the IGFET's 80 and 90.

The designation of source or drain electrode to any one of the electrodes 81, 82, 91 or 92 is dependent upon whether the input signal voltage is positive or negative with respect to the ground reference. For example, when the input signal voltage is more positive than the ground reference, the electrodes 81 and 91 can be designated source electrodes and the electrodes 82 and 92 as drain electrodes.

In operation, the switching signals 95 and 96 are operative to alternately turn the IGFET's 80 and 90 on and off, whereby the amplifier input connection $\mathbf{17_1}$ is alternately connected to circuit ground and to the signal voltage source 70. That is, the sampling circuit essentially chops or converts the D.C. signal to an A.C. signal. For example, when the waveform 95 is at the $-V_1$ volts level, the IGFET 90 is turned on and the IGFET 80 is turned off since the waveform 96 is at the 0 volt level. Consequently, the input connection $\mathbf{17_1}$ is connected to circuit ground by way of the low impedance source-drain path of IGFET 90. When the waveform 95 changes from $-V_1$ volts to 0 volt, the IGFET 90 turns off and the IGFET 80 turns on due to the waveform 96 changing from 0 volt to $-V_1$ volts, whereby the input connection $\mathbf{17_1}$ is connected to the input signal source 70. When the waveforms 95 and 96 again change the IGFET 80 turns off and the IGFET 90 turns on to connect the input $\mathbf{17_1}$ to circuit ground.

The amplifying stages $\mathbf{10_1}$ through $\mathbf{10_n}$ then amplify the sampled signal. Signal detection means (not shown), such as a synchronous detector responsive to waveforms 95 and 96, may be connected at output terminal 50 to reconvert the signal to D.C.

Since both of the IGFET's 80 and 90 are referenced to circuit ground, the commonly connected electrodes 82 and 91 may be directly connected to the amplifier input $\mathbf{17_1}$ without the use of a coupling capacitor. Thus, when it is desired to fabricate the D.C. amplifier as an integrated circuit structure, the IGFET's 80 and 90 may be fabricated in or on the same substrate as the amplifier stages $\mathbf{10_1}$, $\mathbf{10_2}$ . . . and $\mathbf{10_n}$.

While the invention has been illustrated with P-type IGFET's, it is apparent that N-type IGFET's may also be employed so long as the polarity of the source of operating voltage is accordingly changed.

What is claimed is:

1. Direct coupled amplifier apparatus including *n* stages connected in cascade wherein each stage includes a first insulated gate field-effect transistor connected in the common source configuration and a series impedance means coupled to the drain electrode thereof, the drain electrode of a transistor in one stage being direct coupled to the gate electrode of a transistor in the next succeeding stage; wherein the improvement comprises:
- one of said series impedance means being a second insulated gate field-effect transistor connected in the source-follower configuration and having a source electrode connected to the drain electrode of the associated first transistor,
- means for connecting the gate electrode of said source-follower transistor to a signal input connection, and
- self-biasing means including a feedback element coupled between the drain electrode of the first transistor in the last stage and the gate electrode of the first transistor in the first stage.

2. The invention according to claim 1:
wherein each of the remainder of said series impedances is the source-drain path of a third insulated gate field-effect transistor connected as a field-effect diode.

3. The invention according to claim 2:
wherein said feedback element is the source-drain path of a fourth insulated gate field-effect transistor having a gate electrode connected to a point of fixed potential, and
wherein all of said transistors are enhancement transistors of one conductivity type.

4. The invention according to claim 3:
wherein each of said third transistors has a gate and a drain electrode coupled to a first supply connection, wherein the source electrodes of said first transistors are coupled to a second supply connection, and
wherein the drain electrode of said second transistor is coupled to said first supply connection.

5. The invention according to claim 4:
wherein said feedback element is part of a low pass filter which further includes a bypass capacitor,
wherein operating voltage source means applies operating voltage across said supply connections, and
wherein input signal source means applies signal voltage to said signal input connection.

6. The invention according to claim 5:
wherein said fourth transistor source-drain path is connected between the drain electrode of the first transistor in the last stage and the gate electrode of the first transistor in the first stage, and
wherein said bypass capacitor is coupled between the gate electrode of the first transistor in the first stage and a point of reference potential.

7. The invention according to claim 6:
wherein said second transistor is connected in the first stage.

8. The invention according to claim 1:
wherein each of said *n* stages is coupled between first and second supply connections,
wherein operating voltage source means applies operating voltage across said first and second supply connections,
wherein input signal source means applies signal voltage to said signal input connection, and
wherein said feedback element is part of a low pass filter which further includes a bypass capacitor.

9. The invention according to claim 1:
wherein said direct coupled amplifier apparatus further includes an input sampling circuit, and
wherein said input sampling circuit includes fifth and sixth insulated gate field-effect transistors having their source-drain paths connected in series between signal input terminal means and a point of reference potential, the common connection of said fifth and sixth source-drain paths being connected to said signal input connection, and the gate electrodes of said fifth and sixth transistors being connected to control terminal means.

10. The invention according to claim 8:
wherein each of said *n* stages is coupled between said point of reference potential and a supply connection,
wherein operating voltage source means applies operating voltage to said supply connection, and
wherein input signal source means applies signal voltage to said signal input terminal means.

11. The invention according to claim 4:
wherein said direct coupled amplifier apparatus further includes an input sampling circuit, and
wherein said sampling circuit includes fifth and sixth enhancement insulated gate field-effect transistors of said one conductivity type having their source-drain paths connected in series between signal input terminal means and said first supply connection, the common connection of said fifth and sixth source-drain paths being connected to said signal input connection, and the gate electrodes of said fifth and sixth transistors being connected to control terminal means.

12. The invention according to claim 1:
wherein at least one other of said series impedance means is a third insulated gate field-effect transistor connected in the common source configuration and having a source electrode connected to the drain electrode of the associated first transistor; and
wherein said connecting means includes another signal input connection to the gate electrode of the third transistor.

13. The invention according to claim 12:
wherein each of the remainder of said series impedances is the source-drain path of separate third insulated gate field-effect transistors.

14. The invention according to claim 13:

wherein said one stage immediately precedes said other stage, and wherein said other stage has unity gain as to signals received at the gate electrode of its associated first transistor.

15. The invention according to claim 14:

wherein the gains of the stages in the loop formed by the cascade and feedback connections as to signals at the gate electrodes of the associated first transistor monotonically increase to a maximum and thereafter monotonically decrease around the loop in either direction from the unity gain stage.

16. The invention according to claim 15:

wherein the stage gains are symmetrical with respect to the unity gain stage in either direction around the loop.

References Cited

UNITED STATES PATENTS 3,286,189 11/1966 Mitchell et al. -------- 330—18

ROY LAKE, Primary Examiner

J. B. MULLINS, Assistant Examiner

U.S. Cl. X.R.

330—25, 35